(12) United States Patent
Hsu et al.

(10) Patent No.: US 7,272,029 B2
(45) Date of Patent: Sep. 18, 2007

(54) TRANSITION-ENCODER SENSE AMPLIFIER

(75) Inventors: Steven K. Hsu, Oswego, OR (US); Ram K. Krishnamurthy, Portland, OR (US); Mark A. Anders, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/025,778

(22) Filed: Dec. 29, 2004

(65) Prior Publication Data

US 2006/0140034 A1 Jun. 29, 2006

(51) Int. Cl.
*G11C 11/00* (2006.01)

(52) U.S. Cl. .................. 365/154; 365/156; 365/205; 365/190

(58) Field of Classification Search ........... 365/154, 365/205, 156, 190; 326/86
See application file for complete search history.

(56) References Cited

U.S. PATENT DOCUMENTS

| | | | |
|---|---|---|---|
| 3,820,031 | A | 6/1974 | Smithlin |
| 3,967,061 | A | 6/1976 | Dobias |
| 4,229,823 | A | 10/1980 | Thomson et al. |
| 4,453,229 | A | 6/1984 | Schaire |
| 4,525,848 | A | 6/1985 | Simpson |
| 4,663,767 | A | 5/1987 | Bodlaj et al. |
| 5,646,557 | A | 7/1997 | Runyon et al. |
| 6,005,417 | A | 12/1999 | Mehta et al. |
| 6,028,814 | A | 2/2000 | Lim |
| 6,140,843 | A | 10/2000 | Howard |
| 6,188,596 | B1* | 2/2001 | Holst .................... 365/63 |
| 6,333,645 | B1 | 12/2001 | Kanetani et al. |
| 6,351,150 | B1 | 2/2002 | Krishnamurthy et al. |
| 6,417,698 | B1 | 7/2002 | Williams et al. |
| 6,453,399 | B2* | 9/2002 | Wada ................. 711/167 |
| 6,559,680 | B2 | 5/2003 | Bhushan et al. |
| 6,717,448 | B2* | 4/2004 | Heo et al. ............. 327/202 |
| 6,741,094 | B2 | 5/2004 | Ogawa |
| 6,765,408 | B2 | 7/2004 | Cheng et al. |
| 6,894,536 | B2 | 5/2005 | Martin et al. |
| 6,990,035 | B2* | 1/2006 | Redwine et al. ........ 365/227 |
| 7,154,300 | B2* | 12/2006 | Anders et al. ........... 326/86 |
| 2001/0052797 | A1 | 12/2001 | Bhushan et al. |
| 2003/0001184 | A1 | 1/2003 | Anderson et al. |
| 2003/0099300 | A1 | 5/2003 | Anders et al. |
| 2003/0107411 | A1 | 6/2003 | Martin et al. |

(Continued)

OTHER PUBLICATIONS

Anders, Mark , et al., "A Transition-Encoded Dynamic Bus Technique for High-Performace Interconnects", *IEEE Journal of Solid-State Circuits*, vol. 38, No. 5, (May 2003), pp. 709-714.

(Continued)

*Primary Examiner*—Amir Zarabian
*Assistant Examiner*—Kretelia Graham
(74) *Attorney, Agent, or Firm*—LeMoine Patent Services, PLLC

(57) ABSTRACT

A sense amplifier transition encodes an output signal onto a bus such that the bus signal only transitions when a sensed bit line has a state different from the state of a previously sensed bit line. The sense amplifier includes a storage element that changes state when the bus signal is asserted. The output of the sense amplifier is conditionally inverted based on the state of the storage element.

12 Claims, 6 Drawing Sheets

U.S. PATENT DOCUMENTS

2005/0146357 A1* 7/2005 Anders et al. ............ 326/86
2005/0285631 A1* 12/2005 Goldman et al. ............ 327/1

OTHER PUBLICATIONS

Anders, Mark, et al., "A Trasition-Encoded Dynamic Bus Technique for High-Performace Interconnects", *Circuit Research, Intel Labs/Desktop Products Group Intel Corporation; IEEE Symposium On VLSI Circuits Digest of Technical Papers*, (2002), 2 pgs.

Stan, Mircea R., et al., "Bus-Invert Coding for Low-Power I/O", *IEEE Transactions on very large scale integration (VLSI) systems*, vol. 3, No. 1, (Mar. 1995), pp. 49-58.

Stan, Mircea R., et al., "Coding a Terminated Bus for Low Power", *ECE Dept., Univ. of Massachusetts, IEEE*, (1995),pp. 70-73.

Stan, Mircea R., et al., "Low-Power Encodings for Global Communication in CMOS VLSI", *IEEE Transactions on very large scale integration (VLSI) systems*, vol. 5, No. 4, (Dec. 1997), p. 444-455.

* cited by examiner

TRANSITION-ENCODER SENSE AMPLIFIER

FIELD

The present invention relates generally to integrated circuits, and more specifically to interconnect in integrated circuits.

BACKGROUND

Electrical signals are used for communications inside integrated circuits. As integrated circuits become faster and larger, the electrical signals transition faster and are subjected to longer interconnect delays.

DESCRIPTION OF EMBODIMENTS

Figure 1:
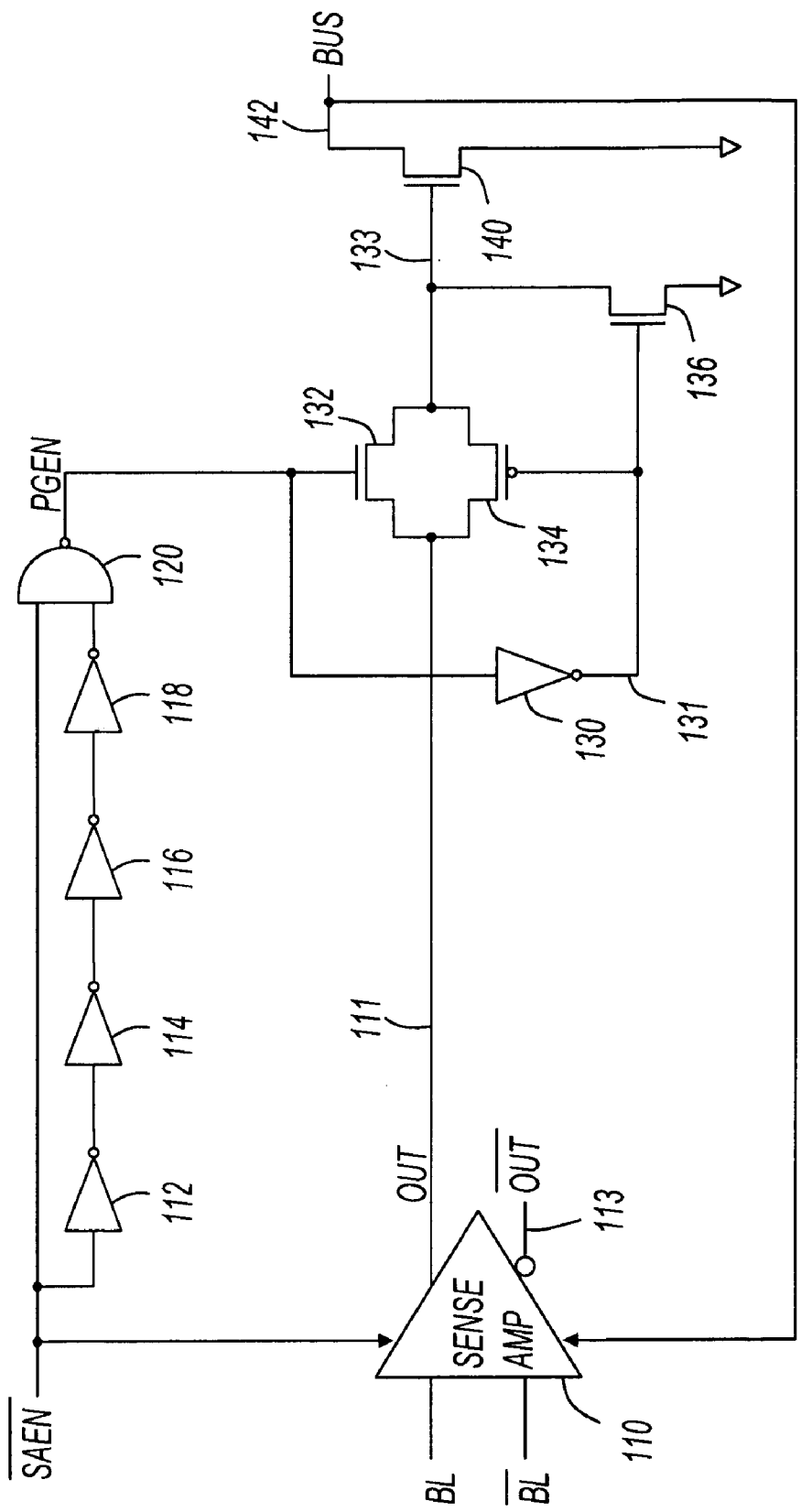
FIG. 1 shows a sense amplifier coupled to a bus.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows a sense amplifier coupled to a bus. Sense amplifier 110 is coupled to bus 142 through a pass gate formed by transistors 132 and 134. In operation, sense amplifier 110 receives a complementary signal from a bit line shown in FIG. 1 as BL and $\overline{BL}$. Further, sense amplifier 110 provides a differential output signal on nodes 111 and 113. As shown in FIG. 1, the output signal on node 111 is coupled to the pass gate formed by transistors 132 and 134. In some embodiments, the complementary output signal on node 113 is coupled to the pass gate, and in still further embodiments, both differential outputs are utilized.

The pass gate formed by transistors 132 and 134 is turned on by a pass gate enable (PGEN) signal generated by logic which includes inverters 112, 114, 116, and 118, and NAND gate 120. The logic circuitry that generates the PGEN signal is responsive to a sense amplifier enable ($\overline{SAEN}$) signal which, in embodiments represented by FIG. 1, is an active low signal. When the sense amplifier enable signal transitions low, a pulse appears on the pass gate enable signal, having a width determined by the delay of the inverters 112, 114, 116, and 118. In some embodiments, delay elements other than inverters are utilized, and in still further embodiments, a sequential element is utilized to produce a pulse on the pass gate enable signal rather than asynchronous circuit as shown in FIG. 1.

When the pass gate enable signal is high, inverter 130 drives node 131 low, and the pass gate formed by transistors 132 and 134 is turned on. Further, transistor 136, which had been holding node 133 low, is turned off.

Transistor 140 has a gate driven by the signal on node 133, and has a drain coupled to the bus on node 142. When node 133 is driven high, transistor 140 turns on and the bus on node 142 is pulled low. When node 133 remains low, transistor 140 does not turn on, and the state of the bus on 142 is not influenced by transistor 140.

The bus signal on node 142 is fed back to sense amplifier 110. In some embodiments, sense amplifier 110 includes a sequential element that changes state in response to the bus signal on node 142. Because sense amplifier 110 includes a sequential element, the output signal produced on nodes 111 and 113 may be transition-encoded. In some embodiments, bus 142 is a "dynamic bus" that offers reduced delays as compared to static busses, in part because of a lower Miller coupling factor. The Miller coupling factor measures effective coupling capacitance to neighboring wires. Embodiments of sense amplifiers having transition-encoded outputs are described more fully in the following figures.

Figure 2:
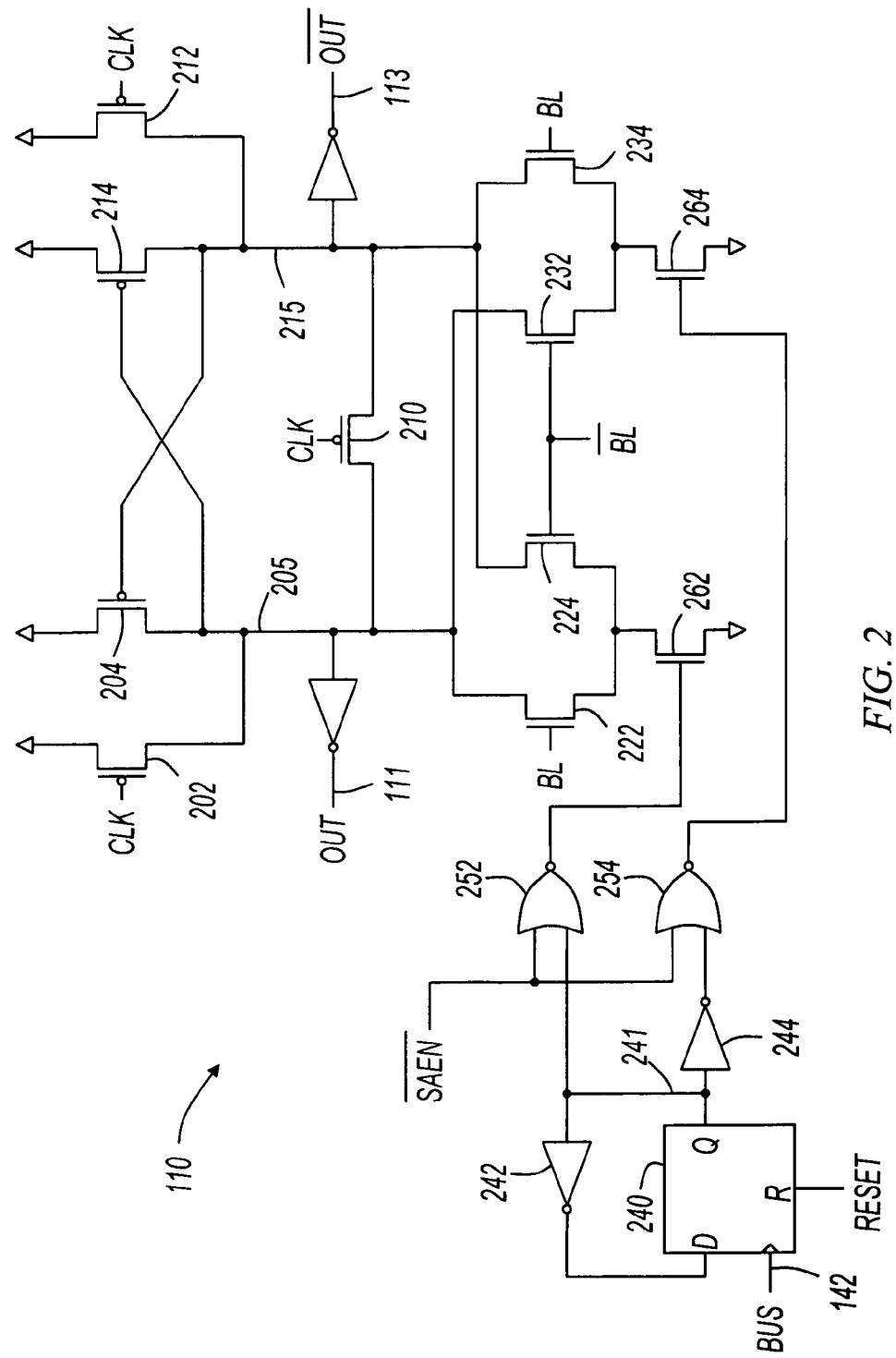
FIG. 2 shows a sense amplifier in accordance with various embodiments of the present invention.

FIG. 2 shows a sense amplifier in accordance with various embodiments of the present invention. Sense amplifier 110 includes cross-coupled transistors 204 and 214, and precharge transistors 202 and 212 driven by a clock signal. Cross-coupled transistors 204 and 214 are coupled to complementary nodes 205 and 215. Transistor 210 is coupled between complementary nodes 205 and 215, and is driven by a clock signal to equalize the voltage on nodes 205 and 215. In operation, when the clock signal is low, nodes 205 and 215 are both pulled high, and transistor 210 is on, thereby equalizing the voltage between complementary nodes 205 and 215. When the clock signal transitions high, transistors 202, 210, and 212 turn off, and allow one of complementary nodes 205 and 215 to be pulled low, and the cross-couple transistors 204 and 214 drive complementary nodes 205 and 215 to opposite logical states.

Also coupled to complementary nodes 205 and 215 are two differential input stages. Each of the two differential input stages is formed by a differential pair of transistors. For example, a first differential input stage is formed by transistors 222 and 224, and a second differential input stage is formed by transistors 232 and 234. The first differential input stage is coupled to an enable transistor 262, and the second differential input stage is coupled to enable transistor 264. When enable transistor 262 is turned on, the first differential input stage is utilized within sense amplifier 110, and when enable transistor 264 is turned on, the second differential input stage is utilized in sense amplifier 110.

The two differential input stages are coupled to input nodes in a complementary manner. By enabling one of enable transistors 262 and 264, sense amplifier 110 provides an inversion between the sense of the bit line signal on the input, and the output signal on the output.

Sense amplifier 110 also includes synchronous element 240. In embodiments represented by FIG. 2, synchronous element 240 is formed using a flip flop, but this is not a limitation of the present invention. For example, any type of memory element capable of storing a previous state may be used without departing from the scope of the present invention. When a reset signal is applied to sequential element 240, sequential element 240 is set to a known state. In embodiments represented by FIG. 2, each time the bus signal on node 142 transitions from low to high, sequential element 240 changes state. The output of sequential element 240 is coupled to NOR gate 252, inverter 242, and inverter 244. The output of inverter 244 is in turn coupled to NOR gate 254. NOR gates 252 and 254 also both receive the sense amplifier enable signal. NOR gates 252 and 254, in conjunction with the remainder of the logic circuitry surrounding sequential element 240, and also in conjunction with the complementary input stages of sense amplifier 110, perform an exclusive-or operation such that the output signals on nodes 111 and 113 only change state when an output is different from a previous output on the bus signal on node 142.

The transistors shown in FIG. 2 are shown as isolated gate transistors, and specifically as metal oxide semiconductor field effect transistors (MOSFETs). For example, transistors 262 and 264 are shown as N-type MOSFETs, and transistors 204 and 214 are shown as P-type MOSFETs. The various embodiments of the present invention are not limited to MOSFETs or isolated gate transistors. For example, the isolated gate transistors may be replaced with junction field effect transistors (JFETs), bipolar junction transistors (BJTs), or any other device capable of performing as described herein, without departing from the scope of the present invention.

Figure 3:
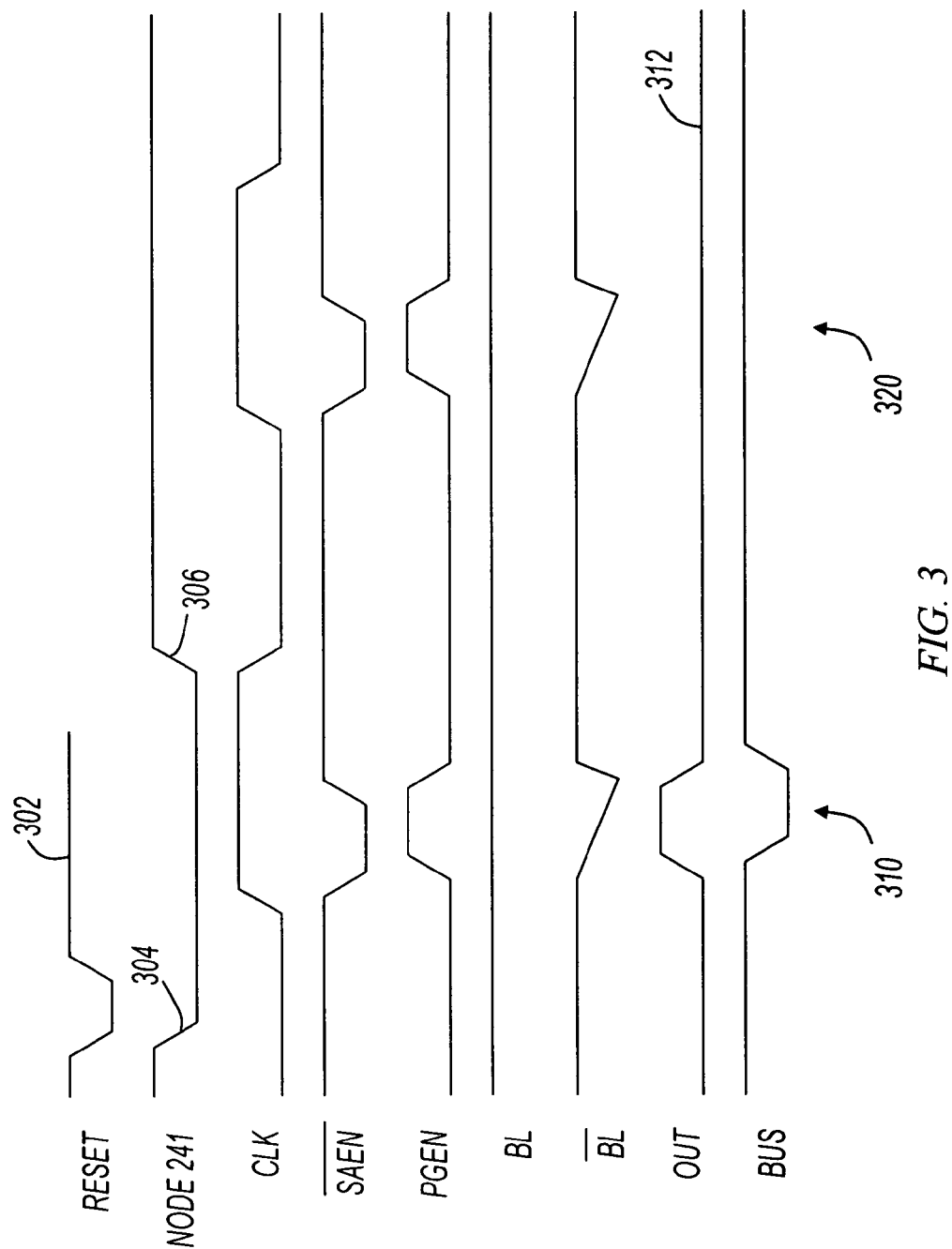
FIG. 3 shows a timing diagram.

FIG. 3 shows a timing diagram. The timing diagram in FIG. 3 is described with reference to the circuits shown in FIGS. 1 and 2. The reset signal at 302 transitions low to reset sequential element 240. This results in node 241 transitioning low at 304. The remainder of the timing diagram in FIG. 3 represents two sensing cycles shown generally at 310 and 320. During each sensing cycle, the clock signal is high, the sense amplifier enable signal is low, and the pass gate enable signal is high. In the example shown in FIG. 3, the bit line and the complementary bit line have the same logical state for both sensing cycles 310 and 320; however, the output signal shown at 312 only transitions high during sensing cycle 310, and does not transition high during sensing cycle 320. When the output signal transitions high in sensing cycle 310, the bus signal is pulled low. This bus signal corresponds to node 142. In response to the bus signal transitioning back high, the state of node 241 changes at 306. Because the state of node 241 has changed, the output signal at 312 takes on the opposite polarity during sensing cycle 320, and the bus signal is not pulled low.

Sensing cycle 320 may be repeated any number of times, and the bus signal will not be pulled low because the sense of the bit lines will not have changed. If however, the bit line has an opposite polarity when sensed, a transition will have occurred and the bus signal will be pulled low. In response, node 241 will again change state, and as long as the bit line does not again change state, the bus line will not be asserted.

Figure 4:
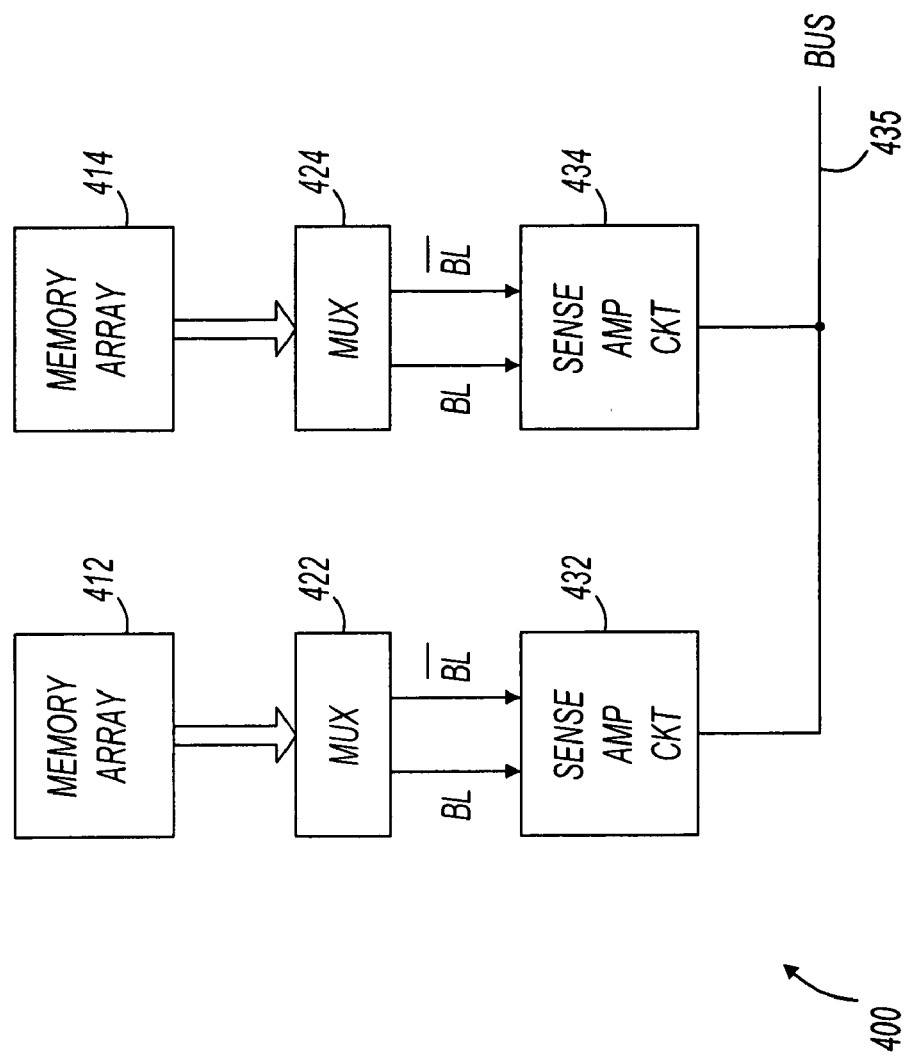
FIG. 4 shows a diagram of a portion of a memory device.

FIG. 4 shows a diagram of a portion of a memory device. Memory device 400 includes memory arrays 412 and 414, multiplexers 422 and 424, and sense amplifier circuits 432 and 434. Memory arrays 412 and 414 may be any type of memory, including static memory, dynamic memory, nonvolatile memory, or volatile memory. Further, memory arrays 412 and 414 may be arrays of any size and any configuration. Multiplexers 422 and 424 receive information from memory arrays 412 and 414 and provide a single complementary bit line output to each of sense amplifier circuits 432 and 434. For example, multiplexer 422 provides one pair of complementary bit line signals to sense amplifier 432, and those complementary bit line signals represent one bit within memory array 412. Each of sense amplifier circuits 432 and 434 may include a pass gate such as that shown in FIG. 1. Further, each of sense amplifier circuits 432 and 434 may include a sense amplifier such as sense amplifier 110 (FIG. 2). In addition, each of sense amplifier circuits 432 and 434 may include a sequential element to store the previous state of the bus signal shown at 435.

In some embodiments, memory array 412 and 414 may be addressed separately, and in any order. For example, memory array 412 may be accessed multiple times in sequence, followed by memory array 414 being accessed multiple times in sequence. Also for example, memory array 412 and memory array 414 may be alternately accessed. In each of these access examples, the sequential elements within the sense amplifier circuits 432 and 434 are updated when the signal on bus 435 transitions. In this manner, each of sense amplifier circuits 432 and 434 maintains the previous state of the bus signal regardless of which sense amplifier circuit drove a signal onto the bus.

Figure 5:
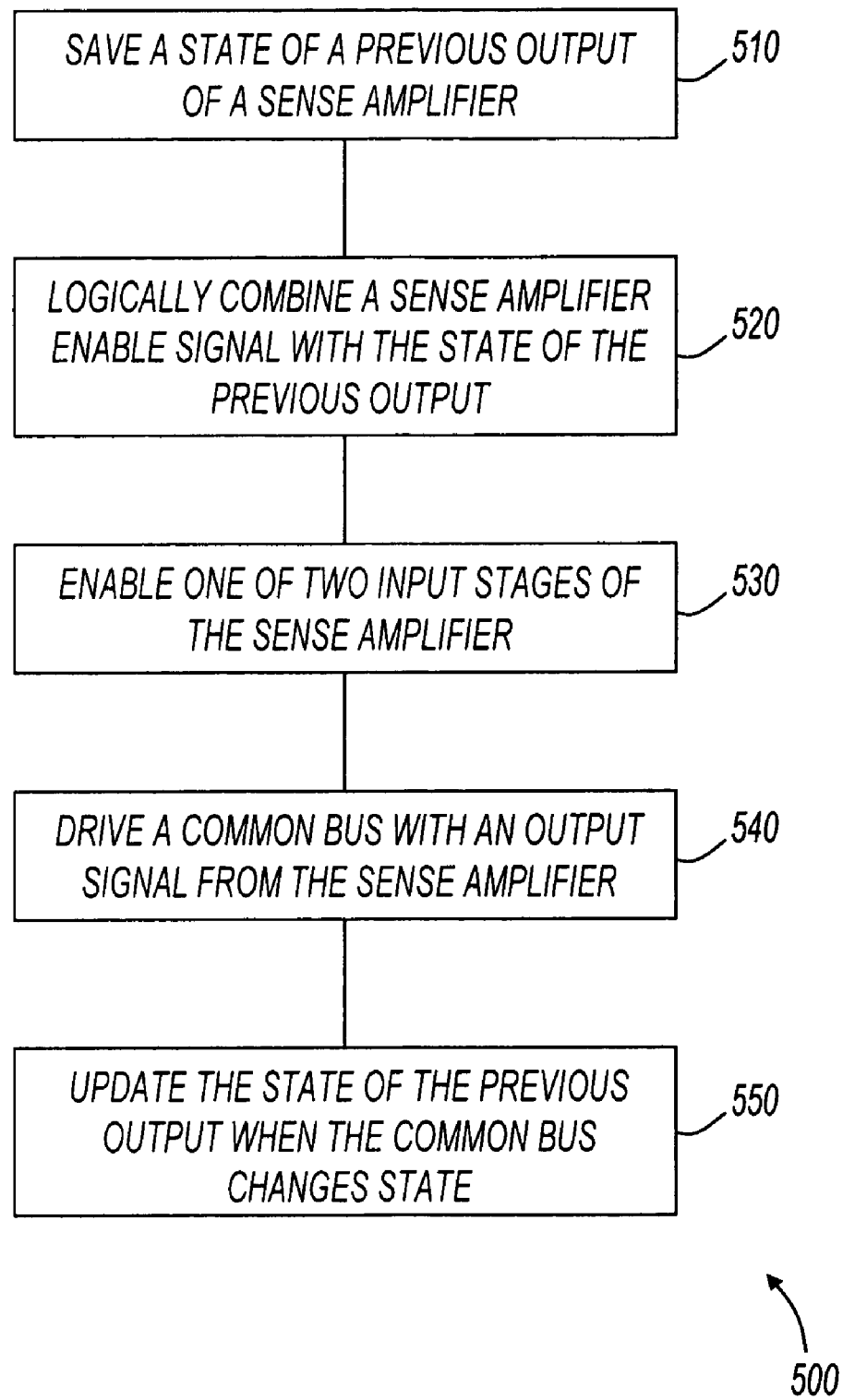
FIG. 5 shows a flowchart in accordance with various embodiments of the present invention.

FIG. 5 shows a flowchart in accordance with various embodiments of the present invention. In some embodiments, method 500 may be used in, or for, a memory device or sense amplifier. In some embodiments, method 500, or portions thereof, is performed by a sense amplifier that drives dynamic interconnect, embodiments of which are shown in the various figures. In other embodiments, method 500 is performed by a memory device or electronic system. Method 500 is not limited by the particular type of apparatus or software element performing the method. The various actions in method 500 may be performed in the order presented, or may be performed in a different order. Further, in some embodiments, some actions listed in FIG. 5 are omitted from method 500.

Method 500 is shown beginning at block 510 in which a state of a previous output of a sense amplifier is saved. In some embodiments, this may correspond to the operation of a sequential element within a sense amplifier, such as sequential element 240 (FIG. 2). At 520, a sense amplifier enable signal is logically combined with the state of the previous output. For example, the sense amplifier enable signal shown in FIG. 2 may be logically combined with the output of sequential element 240 using NOR gates 252 and 254, and the remaining logic surrounding sequential element 240.

At 530, one of two input stages of the sense amplifier is enabled. In some embodiments, this may correspond to the two complementary input stages of sense amplifier 110 (FIG. 2). Each of the complementary input stages may be enabled by enable transistors 262 and 264 in response to the logical combination of signals described at 520. At 540, a common bus is driven with an output signal from the sense amplifier. In some embodiments this may correspond to bus 142 (FIG. 1) being driven as described with reference to FIG. 1. At 550, the state of the previous output is updated when the common bus changes state. For example, as shown in FIG. 3, when the bus signal has a rising edge, node 241 changes state at 306.

Figure 6:
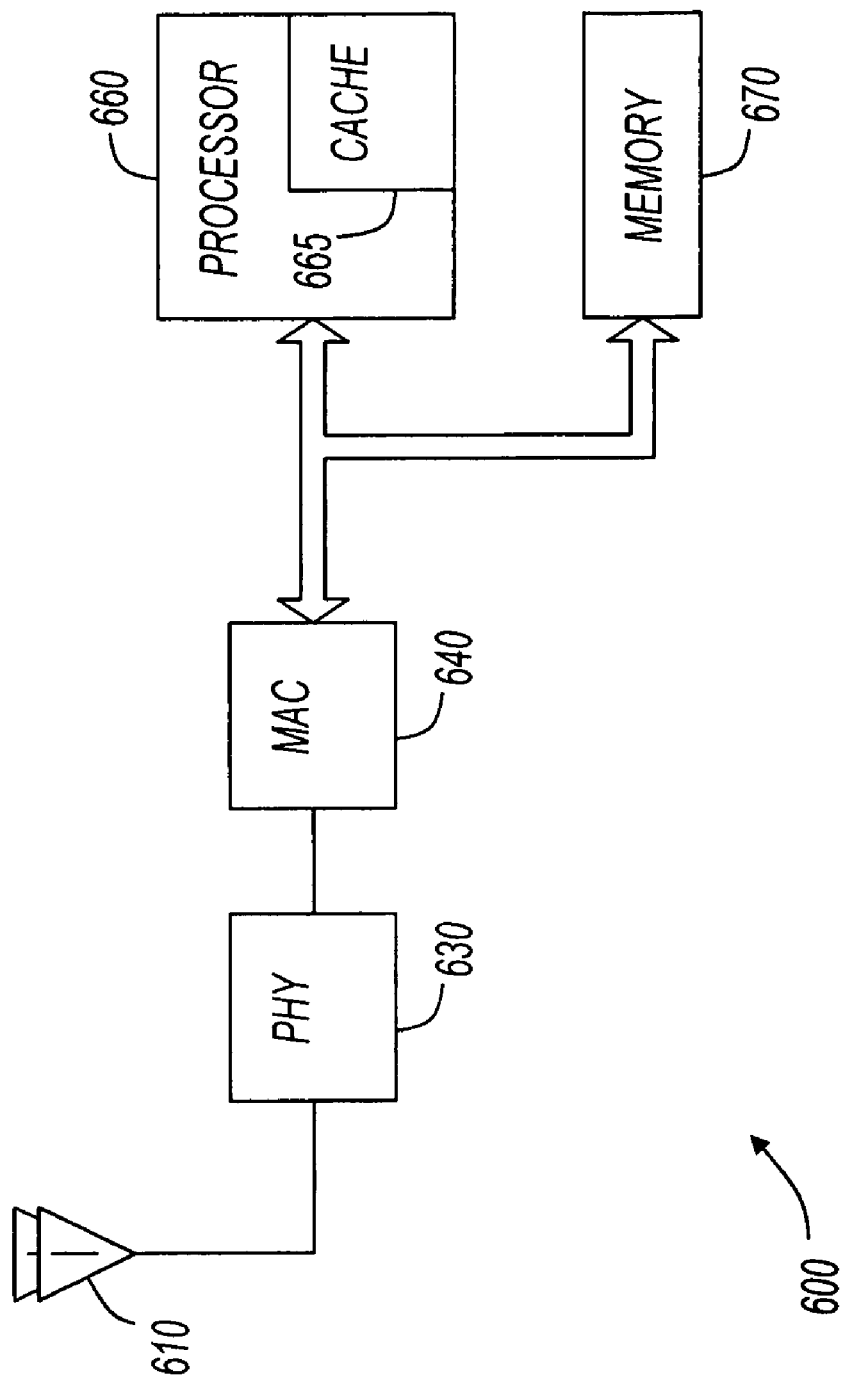
FIG. 6 shows a diagram of an electronic system in accordance with various embodiments of the present invention.

FIG. 6 shows a system diagram in accordance with various embodiments of the present invention. Electronic system 600 includes antennas 610, physical layer (PHY) 630, media access control (MAC) layer 640, processor 660 having cache 665, and memory 670. In some embodiments, electronic system 600 may be a device with wireless capabilities. For example, electronic system 600 may be a computer, a personal digital assistant (PDA), a cellular telephones, any device capable of transmitting or receiving on antennas 610, or a wireless interface in any of these devices.

In some embodiments, electronic system 600 may represent a system in a wireless network. For example, electronic system 600 may include an access point, a mobile station, a base station, or a subscriber unit as well as other circuits. Further, in some embodiments, electronic system 600 may be a computer, such as a personal computer, a workstation, or the like, that includes an access point or mobile station as a peripheral or as an integrated unit. Further, electronic system 600 may include a series of access points that are coupled together in a network.

In operation, system 600 sends and receives signals using antennas 610, and the signals are processed by the various elements shown in FIG. 6. Antennas 610 may be a single antenna, or may be an antenna array or any type of antenna structure that supports various types of diversity. For example, in some embodiments, system 600 may support multiple-input-multiple-output (MIMO) processing. System 600 may operate in partial compliance with, or in complete compliance with, a wireless network standard such as an IEEE 802.11 standard, although this is not a limitation of the present invention.

Physical layer (PHY) 630 is coupled to antennas 610 to interact with other wireless devices. PHY 630 may include circuitry to support the transmission and reception of radio frequency (RF) signals. For example, in some embodiments, PHY 630 includes an RF receiver to receive signals and perform "front end" processing such as low noise amplification (LNA), filtering, frequency conversion or the like. Further, in some embodiments, PHY 630 includes transform mechanisms and beamforming circuitry to support MIMO signal processing. Also for example, in some embodiments, PHY 630 includes circuits to support frequency up-conversion, and an RF transmitter.

Media access control (MAC) layer 640 may be any suitable media access control layer implementation. For example, MAC 640 may be implemented in software, or hardware or any combination thereof. In some embodiments, a portion of MAC 640 may be implemented in hardware, and a portion may be implemented in software that is executed by processor 660. Further, MAC 640 may include a processor separate from processor 660.

Processor 660 represents any type of processor, including but not limited to, a microprocessor, a digital signal processor, a microcontroller, or the like. Cache 665 includes memory configured as a cache memory for use by processor 660. In some embodiments, cache 665 includes transition-encoder sense amplifiers, such as those described with reference to the previous figures.

Memory 670 may be any type of memory suitable for storing information useful to electronic system 600. For example, memory 670 may be a random access memory (RAM), dynamic random access memory (DRAM), static random access memory (SRAM), read only memory (ROM), flash memory, or any other type of memory. In some embodiments, memory 670 includes transition-encoder sense amplifiers, such as those described with reference to the previous figures.

Although the various elements of system 600 are shown separate in FIG. 6, embodiments exist that combine the circuitry of processor 660, memory 670, and MAC 640 in a single integrated circuit. For example, memory 670 may be an internal memory within processor 660 or may be a microprogram control store within processor 660. In some embodiments, the various elements of system 600 may be separately packaged and mounted on a common circuit board. In other embodiments, the various elements are separate integrated circuit dice packaged together, such as in a multi-chip module, and in still further embodiments, various elements are on the same integrated circuit die.

Sense amplifiers, memories, processors, and other embodiments of the present invention can be implemented in many ways. In some embodiments, they are implemented in integrated circuits as part of electronic systems. In some embodiments, design descriptions of the various embodiments of the present invention are included in libraries that enable designers to include them in custom or semi-custom designs. For example, any of the disclosed embodiments can be implemented in a synthesizable hardware design language, such as VHDL or Verilog, and distributed to designers for inclusion in standard cell designs, gate arrays, or the like. Likewise, any embodiment of the present invention can also be represented as a hard macro targeted to a specific manufacturing process. For example, portions of sense amplifier 110 (FIGS. 1,2) may be represented as polygons assigned to layers of an integrated circuit.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. A cache memory having a sense amplifier to provide a transition encoded output signal, the sense amplifier coupled to provide the output signal as a transition encoded signal on a bus, the sense amplifier having enable logic circuitry and a storage element responsive to the transition encoded signal on the bus, wherein the sense amplifier includes complementary input stages, and wherein the enable logic circuitry comprises enable transistors coupled to the complementary input stages to conditionally enable and disable the complementary input stages.

2. A cache memory having a sense amplifier with enable logic circuitry and a storage element to provide a transition encoded output signal of the sense amplifier, wherein the sense amplifier includes complementary input stages, and wherein the enable logic circuitry and the complementary input stages are coupled to perform an exclusive-or logic function, by enabling a first of the complementary input stages when the storage element is in a first state, and by enabling a second of the complementary input stages when the storage element is in a second state.

3. The cache memory of claim 1 further comprising multiple sense amplifiers coupled to a common bus.

4. The cache memory of claim 3 wherein the storage element is coupled to change state in response to changes on the common bus.

5. A cache memory having a sense amplifier with enable logic circuitry and a storage element to transition encode an output signal of the sense amplifier, wherein the sense amplifier includes complementary input stages, wherein the enable logic circuitry comprises enable transistors coupled to the complementary input stages to conditionally enable and disable the complementary input stages, and wherein a first of the complementary input stages is enabled when the storage element is in a first state, and a second of the complementary input stages is enabled when the storage element is in a second state.

6. An electronic system comprising:

an antenna; and an integrated circuit coupled to the antenna, the integrated circuit including a cache memory having a sense amplifier to provide a transition encoded output signal, the sense amplifier coupled to provide the output signal as a transition encoded signal on a bus, the sense amplifier having enable logic circuitry and a storage element responsive to the transition encoded signal on the bus, to transition encode the output signal of the sense amplifier, wherein the sense amplifier includes complementary input stages, and the enable logic circuitry comprises enable transistors coupled to the complementary input stages to conditionally enable and disable the complementary input stages.

7. An electronic system comprising:

an antenna; and an integrated circuit coupled to the antenna, the integrated circuit including a cache memory having a sense amplifier with enable logic circuitry and a storage element to provide a transition encoded output signal of the sense amplifier, wherein the sense amplifier includes complementary input stages;

wherein the enable logic circuitry comprises enable transistors coupled to the complementary input stages to conditionally enable and disable the complementary input stages, and wherein a first of the complementary input stages is enabled when the storage element is in a first state, and a second of the complementary input stages is enabled when the storage element is in a second state.

8. The cache memory of claim 1 wherein the storage element is coupled to change state when the transition encoded signal on the bus is asserted.

9. The cache memory of claim 8 wherein the output signal of the sense amplifier is conditionally inverted based on the state of the storage element.

10. The cache memory of claim 1 wherein the storage element is coupled to change state when the transition encoded signal on the bus is asserted, and wherein one of the complementary input stages is selected by the state of the storage element.

11. The cache memory of claim 3 wherein each of the multiple sense amplifiers includes a storage element coupled to change state when the transition encoded signal on the bus is asserted.

12. An electronic system comprising:

an antenna; and an integrated circuit coupled to the antenna, the integrated circuit including a cache memory having a sense amplifier to provide a transition encoded output signal, the sense amplifier coupled to provide the output signal as a transition encoded signal on a bus, the sense amplifier having enable logic circuitry and a storage element responsive to the transition encoded signal on the bus, to transition encode the output signal of the sense amplifier, wherein the sense amplifier includes complementary input stages, wherein the storage element is coupled to change state when the transition encoded signal on the bus is asserted, and wherein one of the complementary input stages is selected by the state of the storage element.

* * * * *